(12) United States Patent
Tamma et al.

(10) Patent No.: US 11,714,293 B2
(45) Date of Patent: Aug. 1, 2023

(54) SPECKLE REDUCTION IN VCSEL ARRAYS

(71) Applicant: Lumileds LLC, San Jose, CA (US)

(72) Inventors: Venkata Ananth Tamma, San Jose, CA (US); Toni Lopez, Aachen (DE); Varun Dev Kakkar, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 443 days.

(21) Appl. No.: 16/910,823

(22) Filed: Jun. 24, 2020

(65) Prior Publication Data

US 2020/0409165 A1 Dec. 31, 2020

Related U.S. Application Data

(60) Provisional application No. 62/867,572, filed on Jun. 27, 2019.

(51) Int. Cl.
*G02B 27/48* (2006.01)
*H01S 5/42* (2006.01)

(52) U.S. Cl.
CPC .............. *G02B 27/48* (2013.01); *H01S 5/423* (2013.01)

(58) Field of Classification Search
USPC ........................................................ 359/601
See application file for complete search history.

(56) References Cited

U.S. PATENT DOCUMENTS

| 6,975,294 B2 | 12/2005 | Manni et al. |
| 7,649,610 B1 | 1/2010 | Dultz et al. |
| 8,743,923 B2 | 6/2014 | Geske et al. |
| 2008/0129896 A1 | 6/2008 | Kuwata et al. |
| 2009/0096999 A1* | 4/2009 | Frahm .................. G03B 21/006 353/101 |
| 2009/0310087 A1* | 12/2009 | Itoh ....................... H04N 9/3152 353/38 |
| 2012/0147279 A1 | 6/2012 | Koyanagi et al. |
| 2012/0218615 A1 | 8/2012 | Yasuda |

(Continued)

FOREIGN PATENT DOCUMENTS

| CN | 107991835 A | 5/2018 |
| CN | 108616031 A | 10/2018 |

(Continued)

OTHER PUBLICATIONS

Translation of WO2011131586 (Year: 2023).*

(Continued)

*Primary Examiner* — Jerry L Brooks

(57) ABSTRACT

A light emitting device comprises a plurality of coherent light sources, and a plurality of light scattering structures. Each light scattering structure is located in an optical path for light output from a different corresponding one of the coherent light sources. Each light scattering structure comprises an arrangement of nanoantennas embedded in an electrically responsive material and electrical contacts by which to apply a voltage to the electrically responsive material. Application of a time varying electrical signal causes the refractive index of the electrically responsive material in a light scattering structure to vary and thereby varies light scattering by the nanoantennas in the light scattering structure. This effect may be used to reduce speckle caused by interference of light output by the coherent light sources.

20 Claims, 4 Drawing Sheets

(56) References Cited

U.S. PATENT DOCUMENTS

2015/0043079 A1    2/2015  Park et al.
2019/0049097 A1    2/2019  Rossi et al.

FOREIGN PATENT DOCUMENTS

| DE | 19924519 A1 | 10/2000 | |
| JP | 2007271667 A * | 10/2007 | |
| TW | 201739131 A | 11/2017 | |
| WO | WO-2011131586 A2 * | 10/2011 | ....... H01L 31/03529 |

OTHER PUBLICATIONS

Translation of JP-2007271667-A (Year: 2023).*
From the EPO as the ISA, Notification of Transmittal of the International Search Report and the Written Opinion of of the International Searching Authority, corresponding to PCT/US2020/039774, dated Oct. 27, 2020, 12 pages.
Search Report for Patent Application, ROC (Taiwan) Patent Application No. 109121930, dated Apr. 30, 2021, 1 page.

* cited by examiner

SPECKLE REDUCTION IN VCSEL ARRAYS

CROSS REFERENCE TO RELATED APPLICATIONS

This application claims benefit of priority to U.S. Provisional Patent Application No. 62/867,572 filed Jun. 27, 2019, which is incorporated herein by reference in its entirety.

TECHNICAL FIELD

The present disclosure generally relates to structures for speckle reduction in illumination from coherent light sources, particularly for VCSEL arrays.

BACKGROUND

Speckle can be a consequence of diffuse reflection of coherent radiation from rough surfaces resulting in interference of many waves of the same frequency, each having different phases and amplitudes, which add together to give a resultant wave having an intensity that varies randomly in a speckle pattern.

In imaging applications, for example facial recognition, driver-monitoring etc., where a camera is used to take a picture/frame, a speckle pattern in the illumination for the image is perceived as noise. If the speckle contrast is too high, then information signal can be lost in the dark regions of the speckle illumination in the image frame.

Due to small source size and fairly collimated light output, vertical cavity surface emitting lasers (VCSELs) are efficient in beam shaping, which increases the light utilization in imaging applications by redirecting most of the light from the source (VCSEL) to within the camera field of view (FOV). This is an advantage over other illumination technologies (e.g. LEDs) because with a VCSEL source the illumination within the camera FOV can be optimized with high uniformity and minimal energy use by the source. A disadvantage of using a VCSEL source for imaging applications is speckle pattern formation due to the coherence of the light emitted by the VCSEL source or sources. In order to use VCSELs as illumination sources for imaging, the speckle pattern must be reduced.

Fundamentally, speckle at a given point arises due to the interferences of numerous waves arriving from different directions with a fixed phase relationship. Therefore, many methods to reduce speckle rely on time averaging of a number of statistically independent, un-correlated, non-interfering waves (or images/patterns when used in imaging systems). For example, introducing diversity in wavelength, polarization, incidence angle, and/or time, can all reduce or eliminate speckle.

Mechanical movement of coherent sources, optics, or speckle target can also be used to reduce speckle, because waves or patterns subjected to time varying optical properties can reduce speckle. For example, mechanically rotating diffuse glass is a common laboratory method to reduce speckle. Alternatively, rotating diffusers, vibrating diffractive optical elements, or vibrating packaging or other components can reduce speckle. However, for applications in portable, low power hand-held devices, speckle reduction methods that use compact, solid-state, and mechanical vibration free approaches are needed.

SUMMARY

This specification discloses speckle reduction for coherent light sources using light scattering structures in which a plurality of nanoantennas are embedded in a liquid crystal, electro-optic medium, or other electrically responsive material for which application of a time-varying electric signal (e.g., a time varying voltage) can vary the refractive index.

As used herein, a nanoantenna refers to a single light scatterer, or to an arrangement of two or more light scatters in close proximity to each other, for example at distances from each other comparable to or less than the wavelength of light emitted by the coherent light source.

Such a light scattering structure is located in the optical path of light output from a coherent light source. Light scattering from the nanoantennas depends on the refractive index of the material in which they are embedded. Consequently an electrically driven time variation of the refractive index of the material in which the nanoantennas are embedded dynamically varies the direction, phase, polarization, and/or amplitude of light from the coherent light sources that is scattered by the nanoantennas.

The coherent light sources may be, for example, VCSELs in a VCSEL array.

To reduce speckle from interference between two or more coherent light sources, a plurality of such light scattering structures is arranged with each light scattering structure corresponding to, and positioned in the optical path of, a different coherent light source (e.g., of a different VCSEL in a VCSEL array). Each light scattering structure comprises an arrangement of nanoantennas embedded in the electrically responsive material. Each light scattering structure may be separately electrically driven to vary the refractive index of its electrically responsive material, thereby varying the scattering of light from the corresponding coherent light source by the arrangement of nanoantennas in the light scattering structure. The changes in light scattering may be changes in direction, phase, and amplitude of the scattered light, for example.

Each light scattering structure may comprise a unique arrangement of nanoantennas, differing from the arrangements in other light scattering structures. Alternatively, each light scattering structure may comprise an identical arrangement of nanoantennas, or several different arrangements may be used with multiple light scattering structures using identical arrangements.

If the arrangements of nanoantennas in all of the light scattering structures is identical, then to achieve the desired reduction in speckle each light scattering structure is driven by a different electrical signal, differing from the electrical signals to the other light scattering structures in phase or time delay, for example. If the arrangement of nanoantennas in each light scattering structure is unique, the light scattering structures may be driven with the same electrical signal, or alternatively each by a different electrical signal. Each light scattering structure (whether unique in arrangement or not) may be driven randomly, for example, which may result for example in time varying random phase shifts between light scattered from different light scattering structures. Each of these cases results in time varying light scattering from each light scattering structure differing from that in the other light scattering structures, which reduces speckle.

The time varying signal may have a frequency of, for example, about 10 kilohertz to several hundred kilohertz, for example up to about 1 megahertz. Higher or lower frequencies may be used, if suitable.

The electrically responsive material in a light scattering structure may be a nematic or twisted nematic liquid crystal, for example, in which case it may have a refractive index of about 1.5 with birefringence of about 0.2 to 0.4 induced by the applied electrical signal, for example. Alternatively, the electrically responsive material may be a solid electro-optic material such as, for example, lithium niobate, potassium titanyl phosphate (KTP), or beta-barium borate (BBO). If the electrically responsive material is a liquid crystal, it may for example be housed with the nanoantennas or in contact with the nanoantennas in a cell having top and bottom light-transparent (e.g., Indium Tin Oxide coated glass) electrical conductors. Applying a time varying voltage between the conductors causes changes in the alignment of the liquid crystal molecules thereby causing changes in the refractive index of the liquid crystal. This causes a time-varying change in the scattering and polarization state of the nanoantennas.

The arrangement of nanoantennas in each light scattering structure may form a surface optical element having a subwavelength thickness (e.g., a few hundred nanometers) in the optical path, in which case it may be considered a metasurface. (A metasurface is a collection of nanoantennas arranged such that the optical properties of the arrangement are determined by the properties of the individual antennas and their coupling to neighboring antennas. The thickness of a metasurface can be of order a wavelength or less.) In such a case the nanoantennas are embedded in the electrically responsive material in the sense that the electrically responsive material is in physical contact with the metasurface. Alternatively the arrangement of nanoantennas in each light scattering structure can be implemented as bulk materials (e.g. having a thickness of several hundred nanometers to a few microns in the optical path) with nanoantennas distributed in an ordered or disordered (e.g., random) arrangement in the electrically responsive material, in which case it may be considered a metamaterial.

Whether implemented as a surface (metasurface) or bulk (metamaterial) optical element, the nanoantennas in each light scattering structure may be arranged in periodic, a-periodic, or pseudo-random arrangements. The spacing between adjacent nanoantennas may be, for example, tens of nanometers to hundreds of nanometers. The underlying principle of these devices is to randomize the scattering of coherent light using metasurfaces or metamaterials. This can be achieved for example by creating arrays of nanoantennas with pseudo-randomness in shapes and positions by spatially varying the size, shape, and/or spacing between nanoantennas. Even without the use of an electrically responsive material to modulate the refractive index around the nanoantennas, the metasurface or metamaterial may be designed to randomize the directions, phase and polarization of the light it scatters.

Typically, each nanoantenna has sub-wavelength dimensions, compared to the wavelengths of light emitted by the light sources. For example, for a near IR operating wavelength of 940 nanometers each nanoantenna may have a longest dimension of for example about half a wavelength (e.g., about 500 nanometers) and a smaller lateral dimension. The nanoantennas in a light scattering structure may differ in size, shape, material, and spatial layout. The nanoantennas may have dimensions, structures, and shapes making them resonant with the light emitted by the light sources (e.g., longest dimensions of about one half the wavelength). Making the nanoantennas resonant increases the magnitude of the change in scattering achieved for a given change in refractive index of the surrounding medium.

Nano-antennas may include, for example, one or more light scatterers having spherical, ellipsoidal, columnar, tapered solid, symmetrical solid pyramidal, hexahedral, octahedral, cuboid, or conical shapes. The light scatterers, and thus the nanoantennas, may be made of metals (e.g., gold, aluminum), dielectrics (e.g., silicon, titanium dioxide), or semiconductors (e.g., gallium nitride).

Resonant nanoantennas operating using Huygen's principle (electromagnetic duality) can have large efficiency compared to non-Huygen's structures. Therefore, Huygen's metasurfaces and metamaterials may be preferred although their use is not required. A Huygen's metasurface or metamaterial is a metasurface or metamaterial in which each nanoantenna is a resonant system that follow Huygen's principle. The nanoantennas can be chosen to radiate only in selected directions, for example only in forward and not in a backward direction.

A Huygen's metasurface/metamaterial used in a light scattering structure can comprise, for example, nanocylinders, nanocones or nanocuboids arranged in either a hexagonal or rectangular lattice. The lattice period can be sub-wavelength or larger than wavelength, compared to the emission wavelength of the coherent light source. These nanostructures can be chosen to satisfy the first Kerker's conditions so that the magnetic and electric dipole radiation cancel in the backward direction yielding a large forward scatter, in which case they may be referred to as Huygen's meta-atoms. Nano-cylinder dimers (for example, a dimer of a large diameter cylinder and a smaller diameter cylinder) may have interfering modes that will help to better control the scattered modes using structural parameters.

The light scattering structures may be used in transmission, with light from the light sources incident on and passing through the light scattering structures. Alternatively, the light scattering structures can be used in reflection, with light from the light sources incident on and scattered by the light scattering structures, but not transmitted through them.

The light scattering structures may be attached to the light sources (e.g., attached to the VCSELs), or otherwise positioned in the optical paths from the light sources.

The light scattering structures may include polarizers, for example in combination with a liquid crystal and allowing polarization to be varied in time. The light scattering structures may comprise light diffusers at or on their light output surfaces.

The light scattering structures may comprise two or more metasurfaces, as described above, in a stacked arrangement.

This invention allows for highly compact, solid-state and low-power operation making it highly suitable for integration into hand-held portable electronics devices. This invention can be applied for example in the areas of face or iris recognition based security systems, driver monitoring system, security camera and similar.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. As used in this specification and the appended claims, the singular forms "a," "an," and "the" include plural referents unless the context clearly indicates otherwise.

Figure 1:
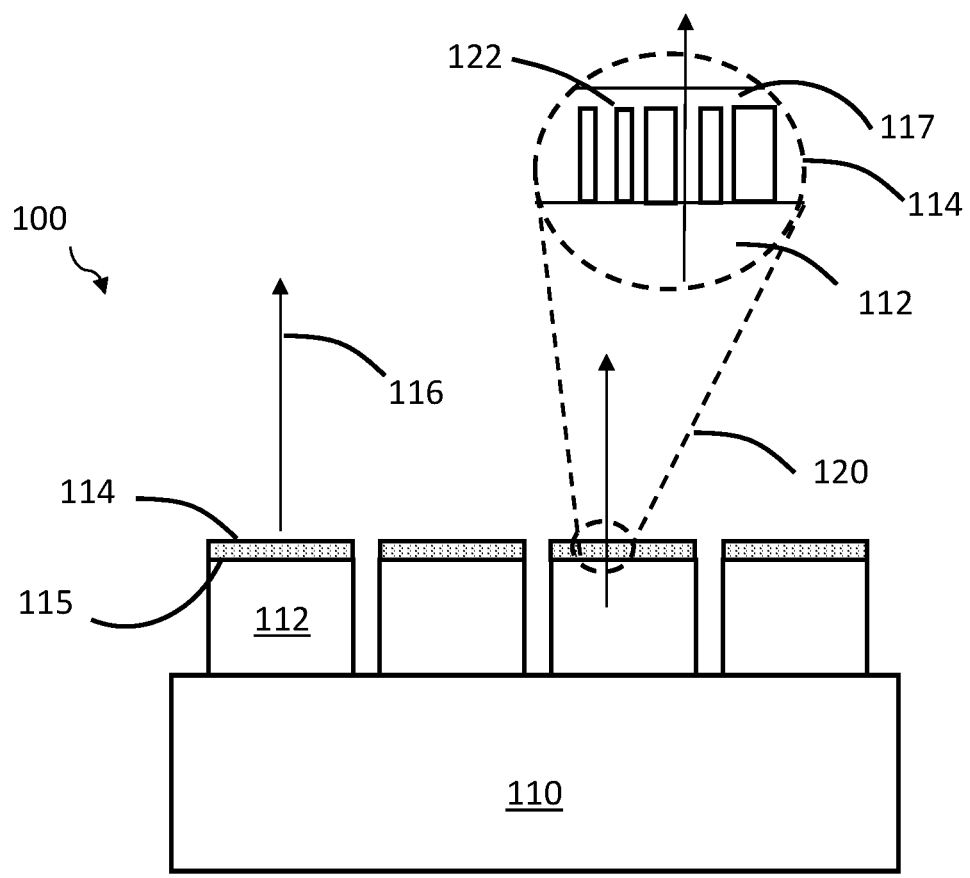
FIG. 1 schematically illustrates an example light emitting device comprising VCSELs and light scattering structures comprising nanoantenna.

FIG. 1 shows a light emitting device 100 comprising VCSELs 112 formed on a substrate 110. Each VCSEL is configured to generate and emit coherent laser light 116 vertically (perpendicularly to the substrate), as shown. A separate light scattering structure 114 is positioned adjacent to (and optionally in contact with) a light emitting surface 115 on top of each VCSEL. As seen in magnified view 120, each light scattering structure 114 comprises a plurality of nanoantennas 122 embedded in an electrically responsive material 117, as summarized above.

Substrate 110, and similar substrates referred to below, can be a patterned sapphire substrate, silicon carbide, glass, or other suitable thin film support. VCSELs 112, and similar VCSELs referred to below, may be formed from any suitable material systems including, but not limited to, Group III-V semiconductors, particularly binary, ternary, and quaternary alloys of gallium, aluminum, indium, and nitrogen, also referred to as III-nitride materials.

Nano-antennas 122, and similar nanoantennas referred to below, can be grown or deposited in various configurations, and may have any suitable shapes, any suitable dimensions, and be formed from any suitable conductive or dielectric material, including those shapes, dimensions, and materials described in the summary above.

Electrically responsive material 117, and similar electrically responsive materials referred to below, may be for example any suitable liquid crystal or electro-optic material. In the example illustrated in FIG. 1, the nanoantennas are arranged to form a surface optical element. In such cases the nanoantennas may optionally be attached to the underlying VCSEL, but this is not required. For example, the nanoantennas may be formed on a III-N light output surface of a VCSEL. As summarized above and further described below, the nanoantennas may be arranged to form a bulk optical element.

Each light scattering structure 114 comprises electrical contacts (not shown in FIG. 1) to the electrically responsive material that are arranged to apply a time varying electrical signal to the electrically responsive material to vary its refractive index and thereby vary scattering by the nanoantennas of light emitted by the underlying VCSEL. The electrical contacts may be, for example, a transparent conductive contact disposed between the light scattering structure 114 and the VCSEL 112, and another transparent conductive contact disposed on the light scattering structure 114 opposite from the VCSEL 112. Examples of such contacts are shown in FIG. 3, and described below with respect to that figure.

Figure 2:
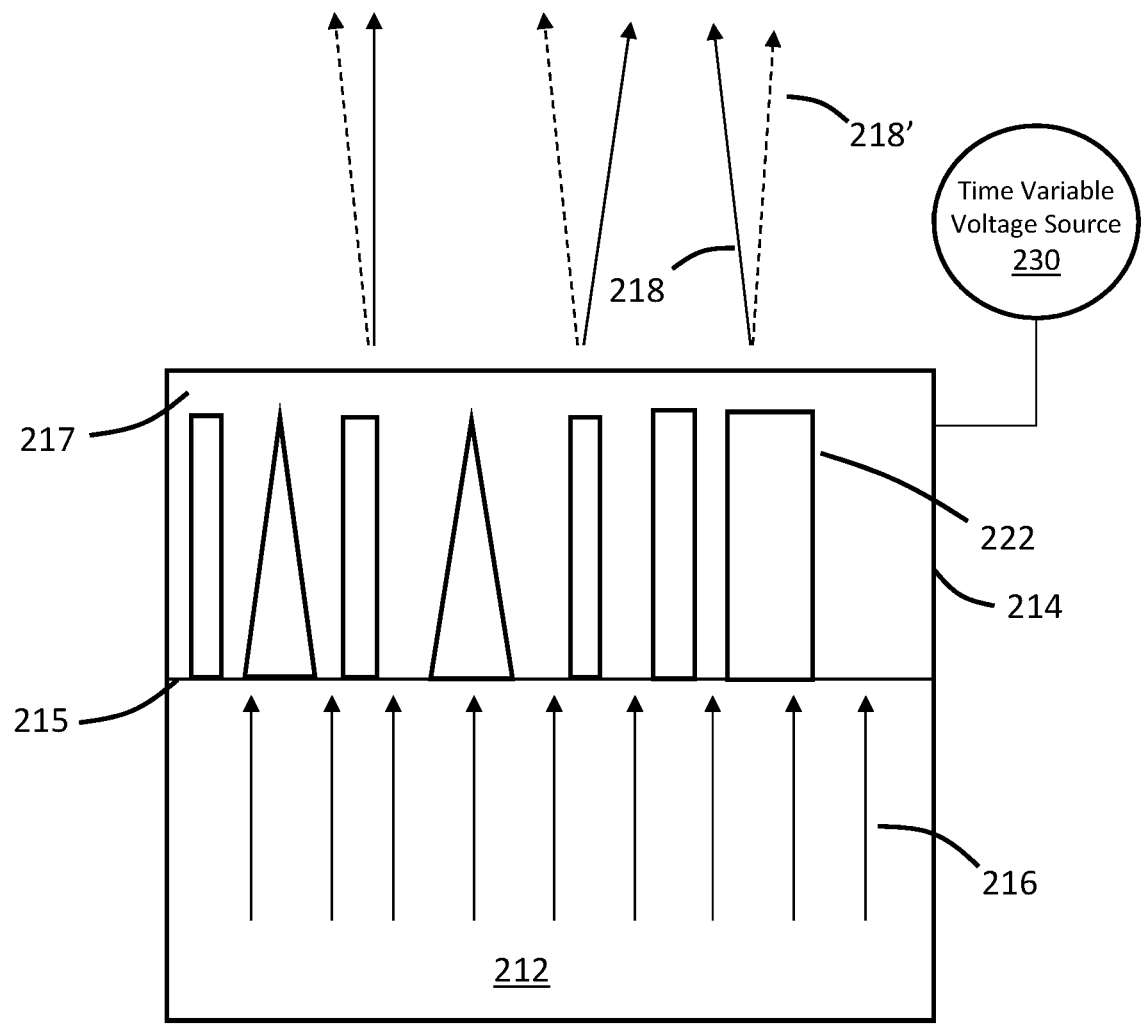
FIG. 2 schematically illustrates operation of an example light scattering structure implemented as a surface optical element.

FIG. 2 schematically illustrates operation of an example surface optic light scattering structure 214 located adjacent to and in contact with a light emitting surface 215 of VCSEL 212 and comprising nanoantennas 222 embedded in electrically responsive material 217. Application of a time varying voltage from voltage source 230 to electrically responsive material 217 varies the refractive index of the material, which changes the light scattering effect of the nanoantennas on light rays 216 incident on the light scattering structure from VCSEL 212. The change in light scattering is schematically indicated by dashed line light rays 218 scattered by the nanoantennas at one applied voltage and by solid line light rays 218 scattered by the nanoantennas at a different applied voltage. As explained above, separately and differently varying the light scattering from different VCSELS (more generally, from different coherent light sources) reduces the speckle caused by interference of light emitted by the different VCSELs.

Figure 3:
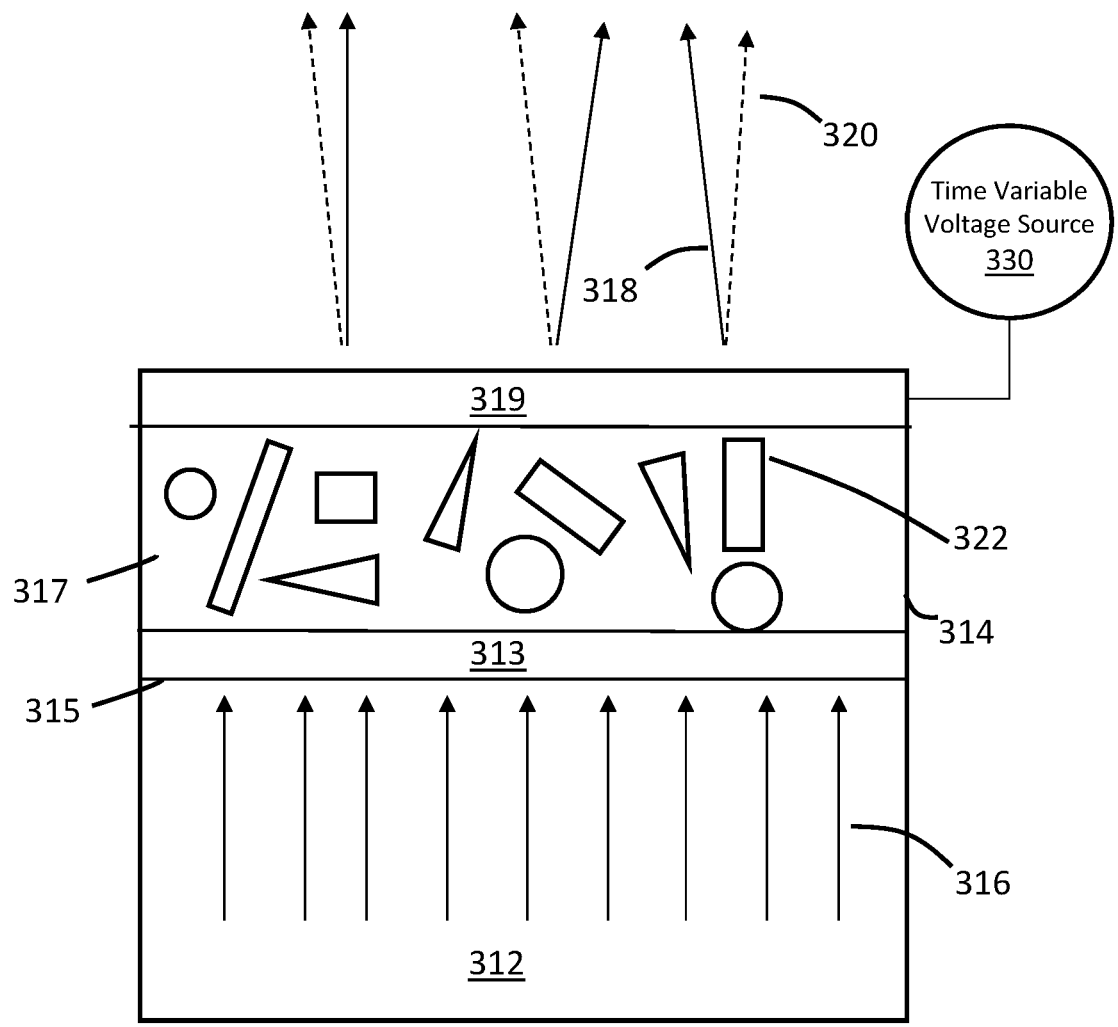
FIG. 3 schematically illustrates operation of an example light scattering structure comprising nanoantenna distributed within a bulk of an electrically responsive material.

FIG. 3 schematically illustrates operation of a light scattering structure 314 located adjacent to a VCSEL 312. Light scattering structure 314 comprises nanoantennas 322 distributed within a bulk of an electrically responsive material 317. A light transparent electrically conductive layer 313 (e.g., formed from Indium Tin Oxide) is disposed between VCSEL 312 and light scattering structure 314. Another, similar, light transparent electrically conductive layer 319 is disposed on light scattering structure 314 opposite from VCSEL 312. Application of a time varying voltage from voltage source 330 between electrically conductive layers 319 and 313 varies the refractive index of electrically responsive material 317, which changes the light scattering effect of the nanoantennas on light rays 316 incident on the speckle reduction structure from VCSEL 312. The change in light scattering is schematically indicated by dashed line light rays 318 scattered by the nanoantennas at one applied voltage and by solid line light rays 320 scattered by the nanoantennas at a different applied voltage.

The example devices shown in FIGS. 1-3 may comprise additional layers or structures not shown. For example, adhesive layers may be employed to attach various components in these devices to each other.

Figure 4:
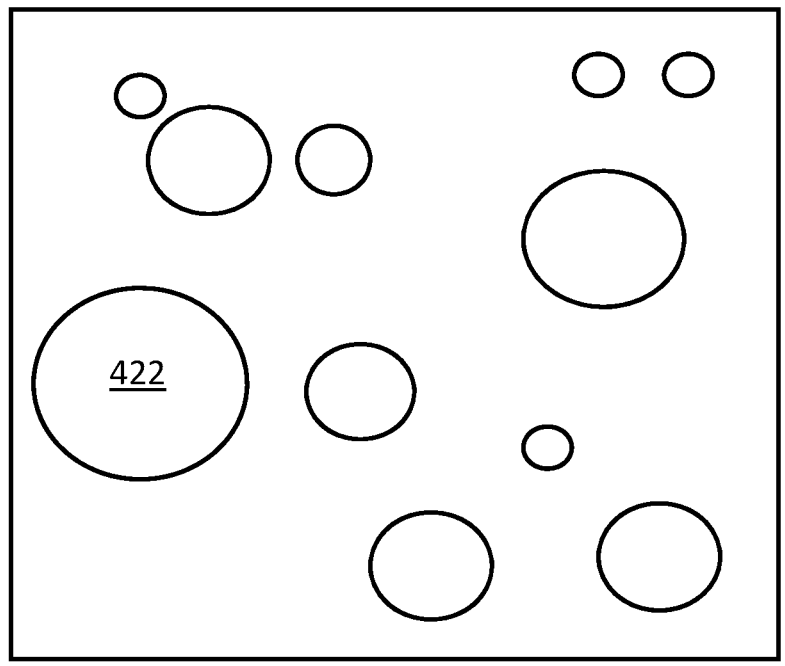
FIG. 4 schematically illustrates in a top down view an example spatial arrangement of nanoantenna in a light scattering structure.

FIG. 4 schematically illustrates in a top down view an example spatial arrangement of nanoantenna 422 in a light scattering structure 414.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A light emitting device comprising:
    a plurality of coherent light sources; and
    a plurality of light scattering structures, each light scattering structure located in an optical path for light output from a different corresponding one of the coherent light sources and comprising an arrangement of nanoantennas embedded in an electrically responsive material and electrical contacts by which a voltage may be applied to the electrically responsive material, each of the nanoantennas having a longest dimension less than or equal to a wavelength of light emitted by the coherent light sources.

2. The light emitting device of claim 1, wherein each of the plurality of coherent light sources is a VCSEL.

3. The light emitting device of claim 1, wherein the arrangement of nanoantennas in each light scattering structure is different from the arrangement of nanoantennas in all of the other light scattering structures.

4. The light emitting device of claim 1, wherein the arrangement of nanoantennas in each light scattering structure is the same as the arrangements of nanoantennas in all of the other light scattering structures.

5. The light emitting device of claim 1, wherein the arrangement of nanoantennas in one of the light scattering structures is different from the arrangement of nanoantennas in at least one other of the light scattering structures.

6. The light emitting device of claim 1, wherein in each light scattering structure the electrically responsive material is or comprises a liquid crystal.

7. The light emitting device of claim 1, wherein in each light scattering structure the electrically responsive material is or comprises an electro-optic material.

8. The light emitting device of claim 1, wherein in each light scattering structure the nanoantennas vary in one or more of: size, shape, and spacing from each other.

9. The light emitting device of claim 1, wherein in each light scattering structure the nanoantennas are resonant at a wavelength emitted by the coherent light sources.

10. A light emitting device comprising:
a plurality of coherent light sources; and
a plurality of light scattering structures, each light scattering structure located in an optical path for light output from a different corresponding one of the coherent light sources and comprising an arrangement of nanoantennas embedded in an electrically responsive material and electrical contacts by which a voltage may be applied to the electrically responsive material, each light scattering structure being implemented as a surface optical element having a thickness parallel to the optical path of light emitted by its corresponding coherent light source of less than or equal to a wavelength of light emitted by the coherent light sources.

11. A light emitting device comprising:
a plurality of coherent light sources; and
a plurality of light scattering structures, each light scattering structure located in an optical path for light output from a different corresponding one of the coherent light sources and comprising an arrangement of nanoantennas embedded in an electrically responsive material and electrical contacts by which a voltage may be applied to the electrically responsive material each light scattering structure being implemented as a bulk optical element having a thickness parallel to the optical path of light emitted by its corresponding coherent light source of greater than a wavelength of light emitted by the coherent light sources.

12. The light emitting device of claim 1, wherein:
each of the plurality of coherent light sources is a VCSEL;
in each light scattering structure the nanoantennas each have a longest dimension less than or equal to a wavelength of light emitted by the coherent light sources; and
in each light scattering structure the nanoantennas are resonant at the wavelength emitted by the coherent light sources.

13. The light emitting device of claim 12, wherein in each light scattering structure the electrically responsive material is or comprises a liquid crystal.

14. The light emitting device of claim 10, wherein each of the plurality of coherent light sources is a VCSEL.

15. The light emitting device of claim 10, wherein in each light scattering structure the electrically responsive material is or comprises a liquid crystal.

16. The light emitting device of claim 10, wherein in each light scattering structure the nanoantennas are resonant at a wavelength emitted by the coherent light sources.

17. The light emitting device of claim 11, wherein each of the plurality of coherent light sources is a VCSEL.

18. The light emitting device of claim 11, wherein in each light scattering structure the electrically responsive material is or comprises a liquid crystal.

19. The light emitting device of claim 11, wherein in each light scattering structure the nanoantennas vary in one or more of: size, shape, and spacing from each other.

20. The light emitting device of claim 11, wherein in each light scattering structure the nanoantennas are resonant at a wavelength emitted by the coherent light sources.

* * * * *